(12) United States Patent
Osame et al.

(10) Patent No.: US 8,664,976 B2
(45) Date of Patent: *Mar. 4, 2014

(54) SHIFT REGISTER AND SEMICONDUCTOR DISPLAY DEVICE

(75) Inventors: Mitsuaki Osame, Atsugi (JP); Aya Anzai, Yokohama (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 201 days.

This patent is subject to a terminal disclaimer.

(21) Appl. No.: 13/248,420

(22) Filed: Sep. 29, 2011

(65) Prior Publication Data

US 2012/0019300 A1 Jan. 26, 2012

Related U.S. Application Data

(63) Continuation of application No. 12/953,038, filed on Nov. 23, 2010, now Pat. No. 8,035,415, and a continuation of application No. 12/565,796, filed on Sep. 24, 2009, now Pat. No. 7,843,217, and a continuation of application No. 11/629,091, filed as application No. PCT/JP2005/011096 on Jun. 10, 2005, now Pat. No. 7,602,215.

(30) Foreign Application Priority Data

Jun. 14, 2004 (JP) ................. 2004-176199

(51) Int. Cl.
*G09G 3/36* (2006.01)
*G11C 19/00* (2006.01)
*G06F 7/38* (2006.01)

(52) U.S. Cl.
USPC ............................. 326/46; 345/100; 377/79

(58) Field of Classification Search
USPC ............... 327/534, 537; 377/78, 79; 345/100; 326/46

See application file for complete search history.

(56) References Cited

U.S. PATENT DOCUMENTS 5,128,974 A 7/1992 Maekawa
5,136,622 A 8/1992 Plus
(Continued)

FOREIGN PATENT DOCUMENTS

EP 1017060 A 7/2000
EP 1056069 A 11/2000
(Continued)

OTHER PUBLICATIONS

International Search Report (Application No. PCT/JP2005/011096; PCT7950) Dated Oct. 11, 2005.

(Continued)

*Primary Examiner* — Thienvu Tran
(74) *Attorney, Agent, or Firm* — Eric J. Robinson; Robinson Intellectual Property Law Office, P.C.

(57) ABSTRACT

The invention provides a shift register which can operate normally while suppressing a delay of signal and a rounding of waveform. The shift register of the invention includes a plurality of stages of flip-flop circuits each of which includes a clocked inverter. The clocked inverter includes a first transistor and a second transistor which are connected in series, a first compensation circuit including a third transistor and a fourth transistor which are connected in series, and a second compensation circuit including a fifth transistor and a transmission gate. According to the first compensation circuit, a timing at which a signal outputted from the flip-flop circuit rises or falls can be controlled in synchronization with an output of two stages before. The second compensation circuit can control a clock signal input can be controlled.

8 Claims, 11 Drawing Sheets

(56) References Cited

U.S. PATENT DOCUMENTS

| | | |
|---|---|---|
| 5,523,966 A | 6/1996 | Idei et al. |
| 5,859,630 A * | 1/1999 | Huq ................................ 345/100 |
| 5,883,798 A | 3/1999 | Yamaguchi |
| 5,936,459 A | 8/1999 | Hamamoto |
| 5,973,533 A | 10/1999 | Nagaoka |
| 6,057,823 A | 5/2000 | Aoki et al. |
| 6,072,345 A | 6/2000 | Ooishi |
| 6,114,907 A | 9/2000 | Sakurai |
| 6,181,183 B1 | 1/2001 | Von Basse et al. |
| 6,232,795 B1 | 5/2001 | Takahashi et al. |
| 6,252,426 B1 | 6/2001 | Fulkerson |
| 6,275,210 B1 | 8/2001 | Maekawa |
| 6,323,691 B1 | 11/2001 | Takahashi |
| 6,377,099 B1 | 4/2002 | Cairns et al. |
| 6,445,215 B1 | 9/2002 | Takahashi et al. |
| 6,563,744 B2 | 5/2003 | Kuroki |
| 6,580,411 B1 | 6/2003 | Kubota et al. |
| 6,593,920 B2 | 7/2003 | Okumura et al. |
| 6,603,453 B2 | 8/2003 | Yamazaki et al. |
| 6,657,459 B2 | 12/2003 | Nishio et al. |
| 6,690,347 B2 | 2/2004 | Jeon et al. |
| 6,759,701 B2 | 7/2004 | Shimizume |
| 6,909,417 B2 | 6/2005 | Washio et al. |
| 6,995,757 B2 | 2/2006 | Okumura et al. |
| 7,002,545 B2 | 2/2006 | Osame |
| 7,109,961 B2 | 9/2006 | Osame |
| 7,133,017 B2 * | 11/2006 | Hayashi et al. ............... 345/100 |
| 7,190,360 B1 | 3/2007 | Hiroki |
| 7,289,096 B2 | 10/2007 | Jeon et al. |
| 7,327,169 B2 * | 2/2008 | Osame et al. .................. 345/104 |
| 7,355,445 B2 | 4/2008 | Kimura |
| 7,460,099 B2 | 12/2008 | Kubota et al. |
| 7,589,708 B2 | 9/2009 | Osame |
| 7,602,215 B2 * | 10/2009 | Osame et al. ................... 326/46 |
| 7,843,217 B2 | 11/2010 | Osame et al. |
| 2001/0040469 A1 | 11/2001 | Takahashi et al. |
| 2007/0024567 A1 * | 2/2007 | Hayashi et al. ............... 345/100 |
| 2007/0024568 A1 * | 2/2007 | Hayashi et al. ............... 345/100 |
| 2007/0147573 A1 * | 6/2007 | Tobita et al. ..................... 377/64 |
| 2007/0208975 A1 * | 9/2007 | Katti et al. ..................... 714/727 |
| 2008/0043898 A1 * | 2/2008 | Kim ................................ 377/75 |
| 2008/0150587 A1 * | 6/2008 | Osame et al. .................... 326/95 |
| 2008/0158133 A1 * | 7/2008 | Ieong et al. .................... 345/100 |
| 2008/0174589 A1 * | 7/2008 | Nagao et al. ................... 345/211 |
| 2008/0273004 A1 * | 11/2008 | Osame et al. .................. 345/100 |

FOREIGN PATENT DOCUMENTS

| | | |
|---|---|---|
| EP | 1231594 A | 8/2002 |
| EP | 1280162 A | 1/2003 |
| EP | 1408614 A | 4/2004 |
| JP | 03-147598 A | 6/1991 |
| JP | 2000-187461 A | 7/2000 |
| JP | 2000-187994 A | 7/2000 |
| JP | 2000-235374 A | 8/2000 |
| JP | 2000-236234 A | 8/2000 |
| JP | 2000-339984 A | 12/2000 |
| JP | 2000-339985 A | 12/2000 |
| JP | 2002-197885 A | 7/2002 |
| JP | 2003-141893 A | 5/2003 |
| JP | 2003-347904 A | 12/2003 |
| JP | 2004-173239 A | 6/2004 |
| JP | 2004-524639 | 8/2004 |
| WO | WO-98/026423 | 6/1998 |
| WO | WO-02/065062 | 8/2002 |

OTHER PUBLICATIONS

Written Opinion (Application No. PCT/JP2005/011096; PCT7950) Dated Oct. 11, 2005.

Search Report (Application No. 05751254.3; PCTEP7950) Dated Nov. 26, 2007.

Office Action (Application No. 200910160190.2;PCTCN07950D1) Dated Mar. 30, 2010.

* cited by examiner

SHIFT REGISTER AND SEMICONDUCTOR DISPLAY DEVICE

TECHNICAL FIELD

The present invention relates to a shift register. And also, the invention relates to a semiconductor display device including a shift register which is formed over the same substrate as a pixel portion.

DESCRIPTION OF THE RELATED ART

Background Art

As the resolution becomes higher in an active matrix semiconductor display device formed by using an inexpensive glass substrate, a peripheral region (frame region) of a pixel portion used for mounting occupies larger area of the substrate, which prevents downsizing of the device. Therefore, there is a limit in a method for mounting an IC which is formed by using a single crystalline silicon wafer, thus a technique to form a driver circuit such as a signal line driver circuit and a scan line driver circuit over the same glass substrate as a pixel portion, that is a technique of System on Panel is considered important.

A thin film transistor, however, has larger variations in characteristics such as a threshold voltage and an on-current thereof is smaller than a single crystalline MOS transistor. Therefore, a higher power source voltage is used for the circuit (internal circuit) formed over the same substrate as the pixel portion than that of a circuit (external circuit) formed as an IC in order to secure an operation of desired specifications. However, various signals such as a clock signal CK inputted from the external circuit to the internal circuit have smaller amplitude of about 3 V since the external circuit operates with a lower power source voltage than the internal circuit. Meanwhile, a normal operation of the internal circuit cannot be secured unless a signal has an amplitude of about 10 V.

A following Patent Document 1 discloses a technique to provide a level shifter in an internal circuit to amplify a signal amplitude inputted from an external circuit so that the internal circuit can operate normally.
[Patent Document 1]
Japanese Patent Laid-Open No. 2000-339985 (refer to pages 3 to 6)

DISCLOSURE OF INVENTION

In the case of providing a level shifter in the internal circuit for amplifying a signal inputted from the external circuit as described in Patent Document 1, problems occur in that the internal circuit occupies a larger area, a signal is delayed, and a waveform is rounded. It is also possible to amplify a signal in the external circuit and then input the signal to the internal circuit. However, when the level shifter is provided in the external circuit for amplifying a signal, a housing has to be formed larger as the number of components for an IC increases, which causes an increase in cost of the semiconductor display device. When a signal is amplified in the external circuit, a high power source voltage has to be supplied to the external circuit as well, which leads to an increase in power consumption.

The invention is made in view of the aforementioned problems to provide a shift register which can operate normally while suppressing a delay of signal and a rounding of waveform. Moreover, the invention provides a semiconductor display device which can operate an internal circuit normally while suppressing an area for the internal circuit and suppressing the delay of signal and the rounding of waveform. Further, the invention provides a semiconductor display device which can operate the internal circuit normally while suppressing the size of a housing and increase in cost and power consumption.

A shift register of the invention includes a plurality of flip-flop circuits, as a register, each of which is inputted with an output of a preceding stage. Moreover, according to the invention, a flip-flop circuit is inputted with an output of two stages before in addition to an output of a preceding stage. A timing at which an output of the flip-flop circuit rises and falls is controlled in synchronization with the output of the two stages before.

In specific, the shift register of the invention includes a plurality of stages of flip-flop circuits each of which has a docked inverter. The clocked inverter includes an inverter including a first transistor and a second transistor which are connected in series, a first compensation circuit including a third transistor and a fourth transistor which are connected in series, and a second compensation circuit including a fifth transistor and a transmission gate. Each drain of the first and second transistors is connected to an output terminal of the clocked inverter, each source of the second and fifth transistors is connected to a second power source, each source of the first and fourth transistors is connected to a first power source, each gate of the third and fourth transistors is inputted with a signal outputted from the clocked inverter of a preceding stage, a first control terminal of the transmission gate and a gate of the fifth transistor are inputted with signals which are outputted from the succeeding stage, a second control terminal of the transmission gate is inputted with an inverted signal of the signal outputted from the succeeding stage, an input terminal of the transmission gate is inputted with a clock signal, an output terminal of the transmission gate and a drain of the fifth transistor are connected to a gate of the second transistor, a source of the third transistor is inputted with a signal which is outputted from the clocked inverter of two stages before, and each drain of the third and fourth transistors is connected to a gate of the first transistor. A potential difference between a first power source potential and a second power source potential corresponds to a power source voltage of the shift register.

The semiconductor display device of the invention includes the shift register over the same substrate as a pixel portion. The shift register may be used for a scan line driver circuit which selects a plurality of pixels in the pixel portion or for a signal line driver circuit which controls video signal inputs to the selected pixels.

A semiconductor display device includes a liquid crystal display device, a light emitting device provided with a light emitting element represented by an organic light emitting element (OLED) in each pixel, a DMD (Digital Micromirror Device), a PDP (Plasma Display Panel), an FED (Field Emission Display), and other display devices each having a driver circuit which has a circuit element using a semiconductor film.

A semiconductor display device includes a panel in which display elements are formed and a module in which an IC and the like including a controller are mounted on the panel. The invention also includes an element substrate which corresponds to a mode before the display elements are completed in the process of manufacturing the semiconductor display device. In specific, the element substrate includes various modes such as the one in which only one of a pair of electrodes of the display element is formed or the one in which a conductive film for the one of the electrodes is formed but the conductive film is not yet patterned to form the one electrode.

It is to be noted that a transistor used for the semiconductor display device of the invention can employ a thin film transistor formed by using a polycrystalline semiconductor, a microcrystalline semiconductor (including a semi-amorphous semiconductor), or an amorphous semiconductor. Note that a transistor formed by using an SOI can also be used. A transistor used for the semiconductor display device of the invention is not limited to a thin film transistor. A transistor formed by using single crystalline silicon may be used as well. Moreover, a transistor formed by using an organic semiconductor or a carbon nanotube can be used. A transistor provided in a pixel of the semiconductor display device of the invention may have a single gate structure, a double-gate structure (a structure having two transistors connected in series), or a multi-gate structure (a structure having a plurality of transistors connected in series) having more than two gates.

A semi-amorphous semiconductor film is a film including a semiconductor of an intermediate structure between amorphous and crystalline structures (including single crystalline and polycrystalline structures). A semi-amorphous semiconductor is a semiconductor having a third state which is stable in free energy. Moreover, a semi-amorphous semiconductor is a crystalline semiconductor having a short distance order and lattice distortion, and formed by dispersing a grain having a diameter of 0.5 to 20 nm in an amorphous semiconductor. Raman spectrum of a semi-amorphous semiconductor is shifted toward lower wave numbers than 520 cm$^{-1}$. The diffraction peaks of (111) and (220), which are believed to be derived from Si crystal lattice, are observed in the semi-amorphous semiconductor film by X-ray diffraction. The semi-amorphous semiconductor film contains hydrogen or halogen by at least 1 atom % or more for terminating dangling bonds. Such a semiconductor is called a semi-amorphous semiconductor (SAS) here for convenience. A favorable semi-amorphous semiconductor can be obtained by promoting the lattice distortion by providing a rare gas element such as helium, argon, krypton, and neon to increase stability.

According to the shift register of the invention, a timing at which a signal outputted from an output terminal of a clocked inverter rises and falls can be controlled by using a signal outputted from two stages before. Accordingly, the shift register can operate normally while suppressing a delay of signal and a rounding of waveform even when an amplitude of a clock inputted to the clocked inverter is smaller than that of a power source voltage.

Moreover, the transmission gate can control a dock signal input to a flip-flop circuit, therefore, a load imposed on a wiring for supplying the clock signal can be reduced.

By using the aforementioned shift register in the semiconductor display device of the invention, an internal circuit can normally operate while suppressing an area for the internal circuit and a delay of signal and a rounding of waveform. Moreover, according to the semiconductor display device of the invention, the internal circuit can operate normally while suppressing the size of a housing and increase in cost and power consumption.

BEST MODE FOR CARRYING OUT THE INVENTION

Although the invention will be fully described by way of example with reference to the accompanying drawings, it is to be understood that various changes and modifications will be apparent to those skilled in the art. Therefore, unless such changes and modifications depart from the scope of the invention, they should be construed as being included therein.

In the following description, a connection includes an electrical connection.

Embodiment Mode 1

Figure 1A:
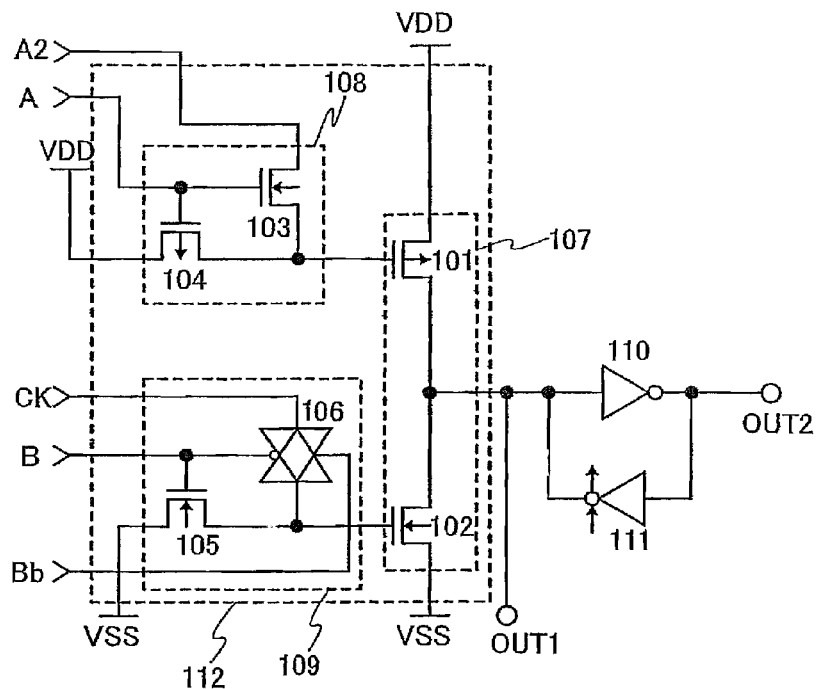
FIGS. 1A and 1B are a circuit diagram and a timing chart of a flip-flop circuit included in the shift register of the invention respectively.

FIG. 1A shows one mode of a flip-flop circuit included in the shift register of the invention. The flip-flop circuit shown in FIG. 1A includes a clocked inverter 112, an inverter 110, and a clocked inverter 111. The clocked inverter 112 includes an inverter 107 including a transistor 101 and a transistor 102, a first compensation circuit 108 including a transistor 103 and a transistor 104, and a second compensation circuit 109 including a transistor 105 and a transmission gate 106.

The shift register of the invention includes a plurality of stages of flip-flop circuits which are inputted with clock signals alternately inverted per stage. For example, a terminal inputted with a clock signal CK in the preceding stage is inputted with an inverted clock signal CKb. On the contrary, a terminal inputted with an inverted clock signal CKb in the preceding stage is inputted with a clock signal CK.

In the inverter 107, each drain of the transistors 101 and 102 is connected to an output terminal (OUT1) of the clocked inverter 112. A source of the transistor 101 is connected to a first power source and supplied with a power source potential VDD. A source of the transistor 102 is connected to a second power source and supplied with a power source potential VSS. It is to be noted that the power source potential VDD and the power source potential VSS satisfy the relationship VDD>VSS. A gate of the transistor 101 is connected to the first compensation circuit 108 while a gate of the transistor 102 is connected to the second compensation circuit 109 respectively. A potential difference between the first power source potential VDD and the second power source potential VSS (VDD–VSS) corresponds to a power source voltage of the shift register.

In the first compensation circuit 108, each gate of the transistors 103 and 104 is inputted with a signal A from an output terminal OUT1 of the clocked inverter 112 used in a flip-flop circuit of the preceding stage. A source of the transistor 103 is inputted with a signal A2 from an output terminal OUT1 of two stages before. A source of the transistor 104 is connected to the first power source and supplied with the power source potential VDD. Each drain of the transistors 103 and 104 is connected to the gate of the transistor 101.

In the second compensation circuit 109, a gate of the transistor 105 and a first control terminal of the transmission gate 106 are inputted with a signal B from an output terminal OUT2 of a flip-flop circuit of the succeeding stage. A source of the transistor 105 is connected to the second power source and supplied with the power source potential VSS. A second control terminal of the transmission gate 106 is inputted with a signal Bb which is an inverted signal of a signal B from an output terminal OUT2 of the succeeding stage. An input terminal of the transmission gate 106 is inputted with a clock signal CK or an inverted clock signal CKb depending on the stage of the flip-flop circuit. A drain of the transistor 105 and an output terminal of the transmission gate 106 are connected to a gate of the transistor 102.

The output terminal OUT1 of the clocked inverter 112 is connected to an input terminal of the inverter 110 and an output terminal of the clocked inverter 111. An output terminal of the inverter 110 and an input terminal of the clocked inverter 111 are connected to the output terminal OUT2 of the flip-flop circuit.

The transmission gate 106 is turned on/off according to potentials of the signals inputted to the first control terminal and the second control terminal. In specific, a potential of the input terminal can be supplied to the output terminal only when a low potential is supplied to the first control terminal and a high potential is supplied to the second control terminal.

In FIG. 1A, the transmission gate 106 is used in the second compensation circuit 109, however, the invention is not limited to this configuration. A switching element such as a thin film transistor (TFT) may be used instead of the transmission gate. The switching element, however, is required to be controlled to be turned on/off in synchronization with the signal B.

Further, the signal A inputted to each gate of the transistors 103 and 104 is not necessarily outputted from the output terminal OUT1 of the preceding stage, and may be outputted from any terminal of the preceding stage. The signal A2 inputted to the source of the transistor 103 is not necessarily outputted from the output terminal OUT1 of two stages before, and may be outputted from any terminal of the two stages before. The signal B inputted to a gate of the transistor 105 and the first control terminal of the transmission gate 106 is not necessarily outputted from an output terminal OUT2 of the succeeding stage, and may be outputted from any terminal of the succeeding stage.

In FIG. 1A, the transistors 101 and 104 are p-channel transistors while the transistors 102, 103 and 105 are n-channel transistors.

Figure 1B:
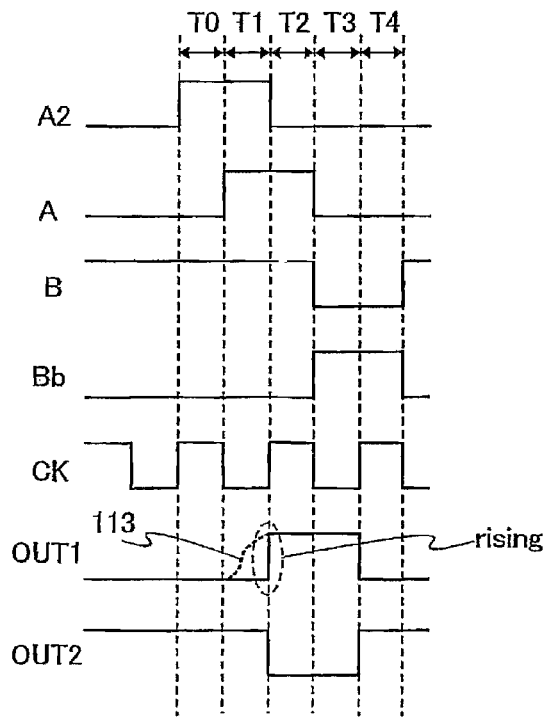

An operation of the flip-flop circuit shown in FIG. 1A is described with reference to FIG. 1B. FIG. 1B shows a timing chart of the signals A, B, A2, Bb, the clock signal CK, the signal outputted from the output terminal OUT1, and the signal outputted from the output terminal OUT2.

In a period T0, the transistor 103 is off and the transistor 104 is on in the first compensation circuit 108, thus the power source potential VDD is supplied to the gate of the transistor 101. In the second compensation circuit 109, the transistor 105 is turned on and the transmission gate 106 is turned off, thus the power source potential VSS is supplied to the gate of the transistor 102. Accordingly, the transistor 101 is turned off and the transistor 102 is turned off in the inverter 107, thus the output terminal OUT1 still holds the potential VSS. The output terminal OUT2 is supplied with an inverted signal of the signal of the output terminal OUT1, that is the potential VDD.

Next, in a period T1, the transistor 103 is on and the transistor 104 is off in the first compensation circuit 108, thus a potential of the signal A2, that is the power source potential VDD, is supplied to the gate of the transistor 101. In the second compensation circuit 109, the transistor 105 is on and the transmission gate 106 is off, thus the power source potential VSS is supplied to the gate of the transistor 102. Therefore, in the inverter 107, the transistor 101 is turned off and the transistor 102 is turned off, thus the output terminal OUT1 still holds the potential VSS. The output terminal OUT2 is supplied with an inverted signal of the signal of the output terminal OUT1, that is the potential VDD.

In a period T2, the transistor 103 is on and the transistor 104 is off in the first compensation circuit 108, thus a potential of the signal A2, that is the power source potential VSS is supplied to the gate of the transistor 101. In the second compensation circuit 109, the transistor 105 is on and the transmission gate 106 is off, thus the power source potential VSS is supplied to the gate of the transistor 102. Therefore, in the inverter 107, the transistor 101 is turned on and the transistor 102 is turned off; thus the power source potential VDD is supplied to the output terminal OUT1. The output terminal OUT2 is supplied with an inverted signal of the signal of the output terminal OUT1, that is the potential VSS.

In a period T3, the transistor 103 is off and the transistor 104 is on in the first compensation circuit 108, thus the power source potential VDD is supplied to the gate of the transistor 101. In the second compensation circuit 109, the transistor 105 is off and the transmission gate 106 is on, thus a low potential (Lo) of the clock signal CK is supplied to the gate of the transistor 102. Accordingly, the transistor 101 is turned off in the inverter 107.

The transistor 102, on the other hand, is turned on or off depending on the potential Lo of the clock signal CK, the power source potential VSS, and a value of a threshold voltage of the transistor 102. For example, in the case where the power source potential VSS is 0 V, the power source potential VDD is 7 V, the potential Lo of the clock signal CK is 2 V, and a high potential (Hi) of the clock signal CK is 0 V, a voltage between the gate and source of the transistor 102 (gate voltage) becomes 2 V, which turns on the transistor 102 when a threshold voltage of the transistor 102 is 0 V. In the period T3, however, the power source potential VDD is supplied from the output terminal of the clocked inverter 111 to the output terminal OUT1. A gate voltage of a p-channel transistor in the clocked inverter 111, which controls a supply of the power source potential VDD to the output terminal OUT1 corresponds to a potential difference between the power source potential VDD and the power source potential VSS. Accordingly, the power source potential VDD is supplied to the output terminal OUT1 even when the transistor 102 is on as the clocked inverter 111 has higher current supply capacity than the clocked inverter 112. The output terminal OUT2 is supplied with an inverted signal of the signal of the output terminal OUT1, that is the power source potential VSS.

In a period T4, the transistor 103 is off and the transistor 104 is on in the first compensation circuit 108, thus the power source potential VDD is supplied to the gate of the transistor 101. In the second compensation circuit 109, the transistor 105 is off and the transmission gate 106 is on, thus a high potential (Hi) of the clock signal CK is supplied to the gate of the transistor 102. Therefore, in the inverter 107, the transistor 101 is off and the transistor 102 is on, thus the power source potential VSS is supplied to the output terminal OUT1. The output terminal OUT2 is supplied with an inverted signal of the signal of the output terminal OUT1, that is the potential VDD.

In the flip-flop circuit shown in FIG. 1A in this manner, a so-called rise timing at which a signal changes from the power source potential VSS to VDD at the output terminal OUT1 can be determined not by the clock signal CK but by the signal A2 from the output terminal OUT1 of two stages before. In a conventional clocked inverter, the transistor 101 which controls a supply of the power source potential VDD to the output terminal OUT1 cannot be completely turned off in the period T1 in the case where an amplitude of the clock signal CK (Hi–Lo) is smaller than the power source voltage. Thus, a signal from the output terminal OUT1 rises earlier before the period T2 starts as shown by a broken line 113 in FIG. 1B. However, by turning on the transistor 101 in synchronization with the signal A2 from the output terminal OUT1 of two stages before, the transistor 101 can be completely turned off in the period T1, thus it can be prevented that the signal rises earlier as described above.

In FIG. 1A, the flip-flop circuit may be designed so that the p-channel transistor of the clocked inverter 111, which controls a supply of the power source potential VDD to the output terminal OUT1 has a channel width W wider than that of the n-channel transistor 102 of the clocked inverter 112, which controls a supply of the power source potential VSS to the output terminal OUT1. By aforementioned configuration, the clocked inverter 111 can have higher current supply capacity to the output terminal OUT1 than the clocked inverter 112 in the period T3.

Figure 7:
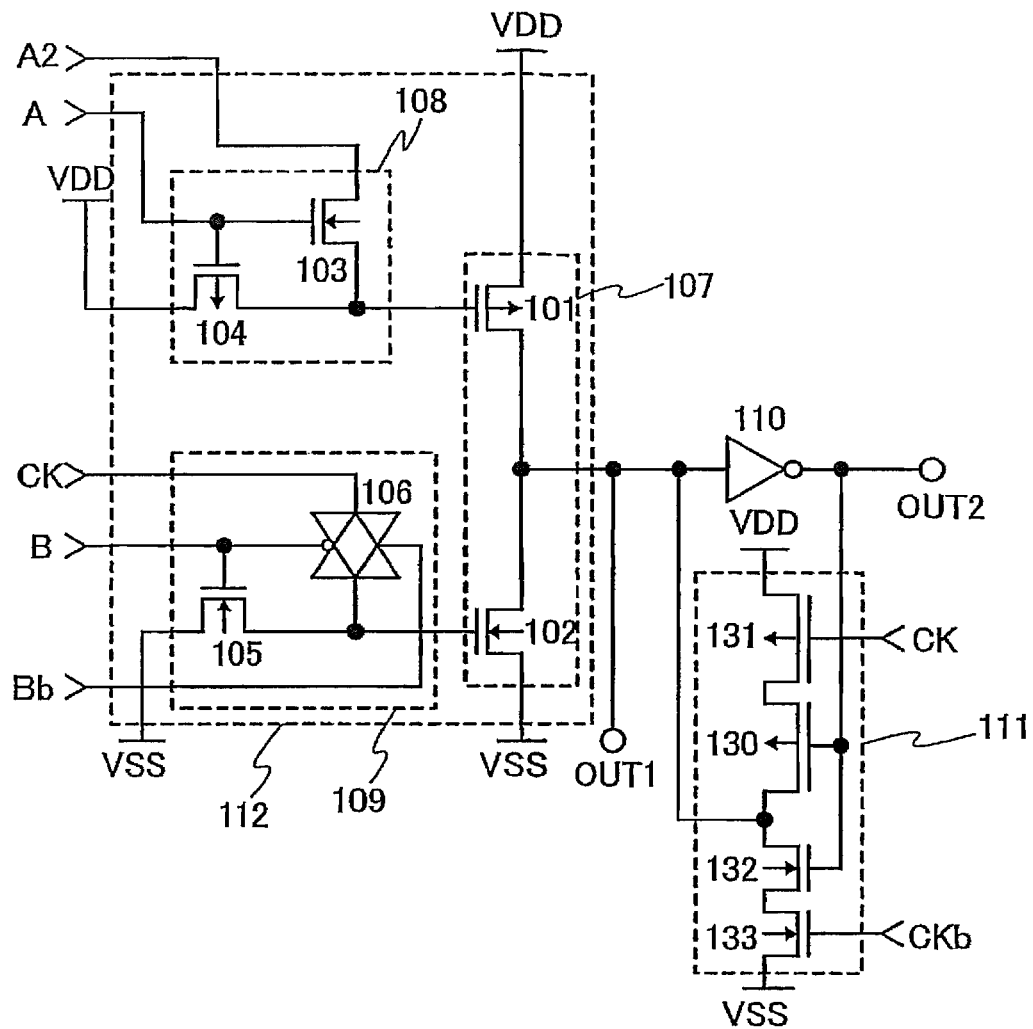
FIG. 7 is a circuit diagram of a flip-flop circuit included in the shift register of the invention.

FIG. 7 shows a detailed configuration example of the flip-flop circuit shown in FIG. 1A. In FIG. 7, elements already shown in FIG. 1A are denoted by the same reference numerals. In FIG. 7, the clocked inverter 111 includes p-channel transistors 130 and 131 which are connected in series, and n-channel transistors 132 and 133 which are connected in series. A gate of the transistor 131 is inputted with a clock signal CK while a gate of the transistor 133 is inputted with an inverted clock signal CKb. A source of the transistor 131 is connected to a first power source and supplied with the power source potential VDD. A source of the transistor 133 is connected to a second power source and supplied with the power source potential VSS. Each drain of the transistors 130 and 132 is connected to an output terminal of the inverter 110. Each drain of the transistors 130 and 132 is connected to an input terminal of the inverter 110.

In the flip-flop circuit shown in FIG. 7, the p-channel transistors 130 and 131 which are connected in series can control a supply of the power source potential VDD to the output terminal OUT1. Accordingly, by designing a channel width W of each of the transistors 130 and 131 wider than that of the transistor 102, the clocked inverter 111 can have higher current supply capacity to the output terminal OUT1 than the clocked inverter 112 in the period T3. Therefore, the output terminal OUT1 can keep the power source potential VDD more securely in the period T3.

In FIG. 1A, a rise timing of a signal outputted from the output terminal OUT1 is determined by the signal A2, however, the invention is not limited to this. The signal A2 may determine a so-called fall timing at which a signal changes from the power source potential VDD to VSS at the output terminal OUT1.

Figure 2A:
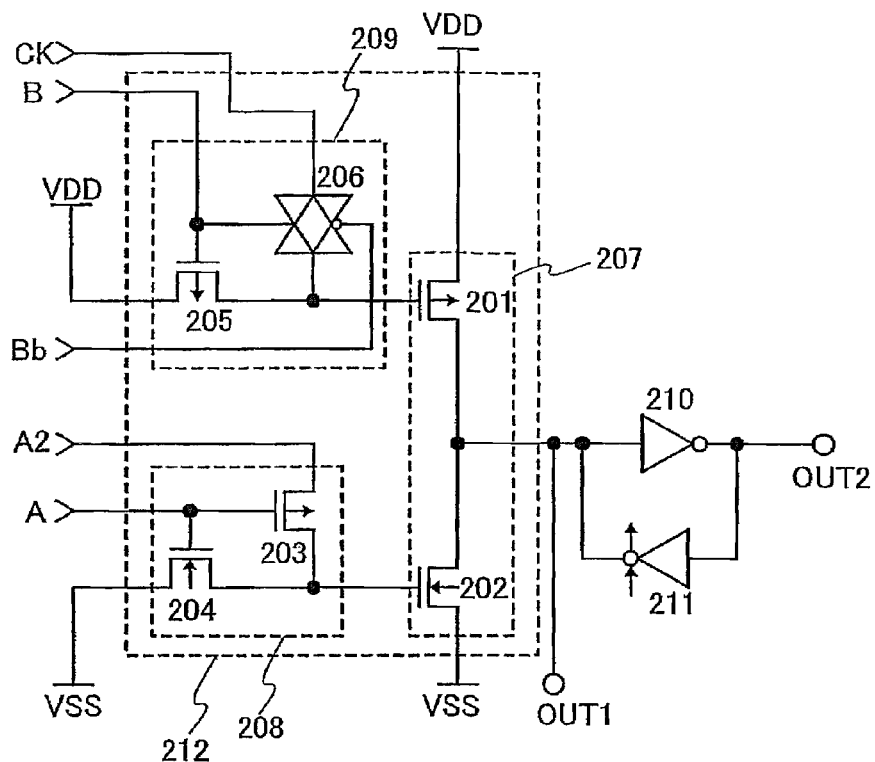
FIGS. 2A and 2B are a circuit diagram and a timing chart of a flip-flop circuit included in the shift register of the invention respectively.

FIG. 2A shows one mode of a flip-flop circuit included in the shift register of the invention, which is different than FIG. 1A. The flip-flop circuit shown in FIG. 2A includes a clocked inverter 212, an inverter 210, and a clocked inverter 211 similarly to the flip-flop circuit shown in FIG. 1A. The clocked inverter 212 includes an inverter 207 including a transistor 201 and a transistor 202, a first compensation circuit 208 including a transistor 203 and a transistor 204, and a second compensation circuit 209 including a transistor 205 and a transmission gate 206.

In the inverter 207, each drain of the transistors 201 and 202 is connected to an output terminal (OUT1) of the clocked inverter 212. A source of the transistor 201 is connected to a first power source and supplied with the power source potential VDD. A source of the transistor 202 is connected to a second power source and supplied with the power source potential VSS. FIG. 2A is different than FIG. 1A in that a gate of the transistor 201 is connected to the second compensation circuit 209 and a gate of the transistor 202 is connected to the first compensation circuit 208 respectively.

In the first compensation circuit 208, each gate of the transistors 203 and 204 is inputted with the signal A from the clocked inverter 212 of a flip-flop circuit of the preceding stage. A source of the transistor 203 is inputted with the signal A2 from the output terminal OUT1 of two stages before. FIG. 2A is different than FIG. 1A in that a source of the transistor 204 is connected to the second power source and supplied with the power source potential VSS and in that each drain of the transistors 203 and 204 is connected to the gate of the transistor 202.

In the second compensation circuit 209, a gate of the transistor 205 and a second control terminal of the transmission gate 206 are inputted with a signal B from the output terminal OUT2 of a flip-flop circuit of the succeeding stage in FIG. 2A. FIG. 2A is different than FIG. 1A in that a source of the transistor 205 is connected to the first power source and supplied with the power source potential VDD, and in that a first control terminal of the transmission gate 206 is inputted with a signal Bb which is an inverted signal of the signal B from the output terminal OUT2 of the succeeding stage. An input terminal of the transmission gate 206 is inputted with the clock signal CK. The input terminal of the transmission gate 206 may be inputted with an inverted clock signal CKb depending on the stage of flip-flop circuit. FIG. 2A is different than FIG. 1A in that a drain of the transistor 205 and an output terminal of the transmission gate 206 are connected to the gate of the transistor 201.

The output terminal OUT1 of the clocked inverter 212 is connected to an input terminal of the inverter 210 and an output terminal of the clocked inverter 211. An output terminal of the inverter 210 and an input terminal of the clocked inverter 211 are connected to the output terminal OUT2 of the flip-flop circuit.

In FIG. 2A, the transmission gate 206 is used in the second compensation circuit 209, however, the invention is not limited to this configuration. A switching element such as a thin film transistor (TFT) may be used instead of the transmission gate. The switching element, however, is required to be controlled to be turned on/off in synchronization with the signal B.

Further, the signal A inputted to each gate of the transistors 203 and 204 is not necessarily outputted from the output terminal OUT1 of the preceding stage, and may be outputted from any terminal of the preceding stage. The signal A2 inputted to the source of the transistor 203 is not necessarily outputted from the output terminal OUT1 of two stages before, and may be outputted from any terminal of the two stages before. The signal B inputted to the gate of the transistor 205 and the second control terminal of the transmission gate 206 is not necessarily outputted from the output terminal OUT2 of the succeeding stage, and may be outputted from any terminal of the succeeding stage.

In FIG. 2A, the transistors 201, 203, and 205 are p-channel transistors while the transistors 202 and 204 are n-channel transistors.

Figure 2B:
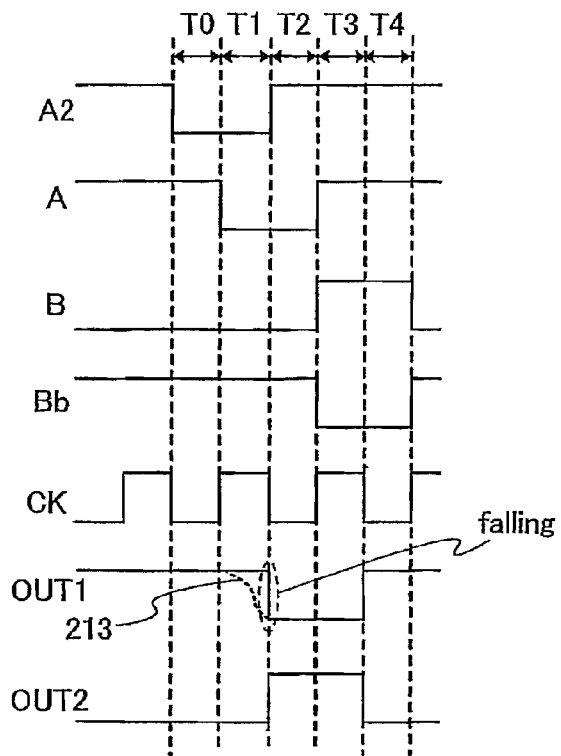

FIG. 2B shows a timing chart of the signals A, B, A2, and Bb, the clock signal CK, the signal outputted from the output terminal OUT1, and the signal outputted from the output terminal OUT2 in FIG. 2A.

In the flip-flop circuit shown in FIG. 2A as shown in the timing chart of FIG. 2B, a so-called fall timing at which a signal changes from the power source potential VDD to VSS at the output terminal OUT1 can be determined not by the clock signal CK but by the signal A2 from the output terminal OUT1 of two stages before. Therefore, by turning on the transistor 202 in synchronization with the signal A2 from the output terminal OUT1 of two stages before similarly to the flip-flop circuit shown in FIG. 1A, the transistor 202 can be completely turned off in the period T1. Accordingly, it can be prevented that a signal falls earlier as shown by a broken line 213 in FIG. 2B.

The n-channel transistor of the clocked inverter 211, which controls a supply of the power source potential VSS to the output terminal OUT1 may be designed to have a channel width W wider than that of the p-channel transistor 201 of the clocked inverter 212, which controls a supply of the power source potential VDD to the output terminal OUT1. By aforementioned configuration, the clocked inverter 211 can have higher current supply capacity to the output terminal OUT1 than the clocked inverter 212 in the period T3. Therefore, the output terminal OUT1 can keep the power source potential VSS more securely in the period T3.

Figure 8:
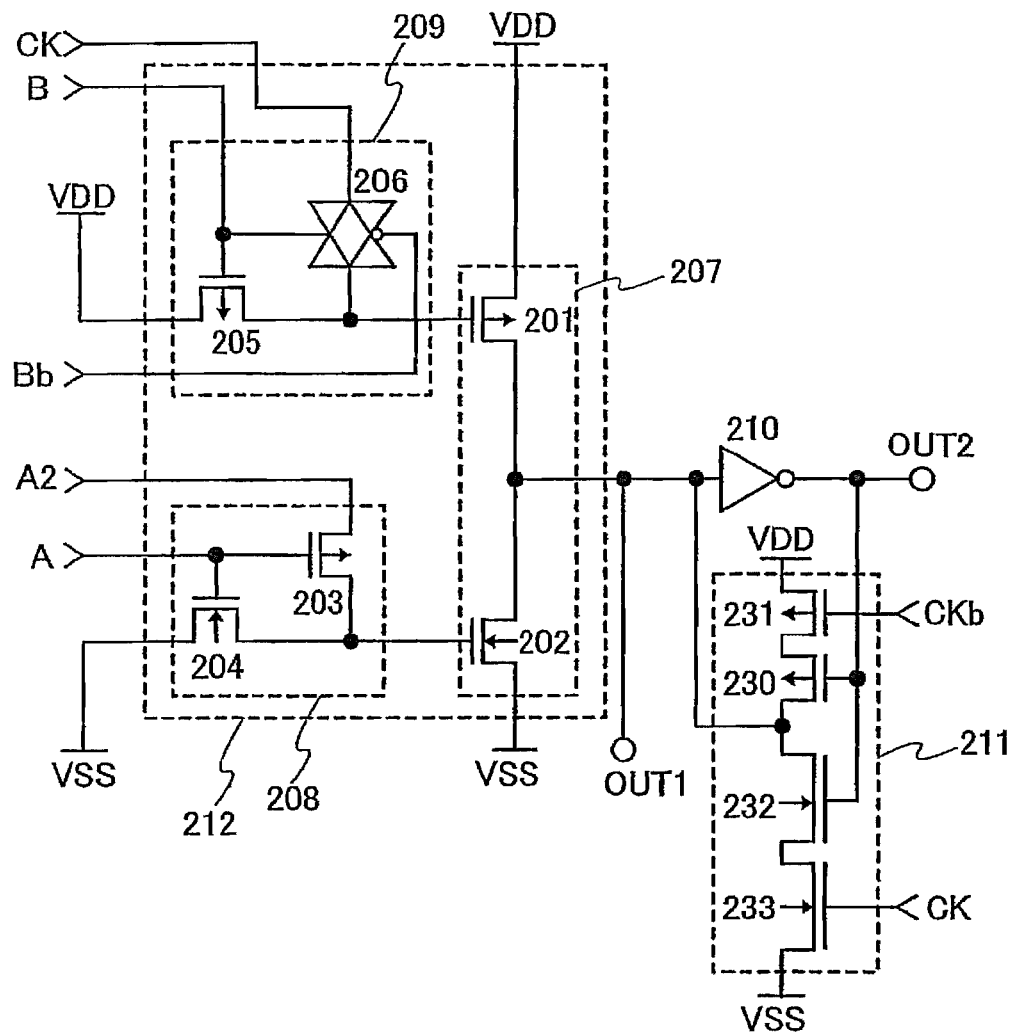
FIG. 8 is a circuit diagram of a flip-flop circuit included in the shift register of the invention.

FIG. 8 shows a detailed configuration example of the flip-flop circuit shown in FIG. 2A. In FIG. 8, elements already shown in FIG. 2A are denoted by the same reference numerals. In FIG. 8, the clocked inverter 211 includes p-channel transistors 230 and 231 which are connected in series, and n-channel transistors 232 and 233 which are connected in series. A gate of the transistor 231 is inputted with the inverted clock signal CKb while a gate of the transistor 233 is inputted with the clock signal CK. A source of the transistor 231 is connected to the first power source and supplied with the power source potential VDD. A source of the transistor 233 is connected to the second power source and supplied with the power source potential VSS. Each gate of the transistors 230 and 232 is connected to an output terminal of the inverter 210. Each drain of the transistors 230 and 232 is connected to an input terminal of the inverter 210.

In the flip-flop circuit shown in FIG. 8, the n-channel transistors 232 and 233 which are connected in series can control a supply of the power source potential VSS to the output terminal OUT1. Accordingly, by designing a channel width W of each of the transistors 232 and 233 wider than that of the transistor 201, the clocked inverter 211 can have higher current supply capacity to the output terminal OUT1 than the clocked inverter 212 in the period T3. Therefore, the output terminal OUT1 can keep the power source potential VSS more securely in the period T3.

In the flip-flop circuits shown in FIGS. 1A and 2A, an input of the clock signal CK is controlled by a switching element (the transmission gate 106 or 206) which operates in synchronization with the signal B. Accordingly, a load imposed on a wiring for supplying the clock signal CK to the flip-flop circuit can be reduced.

A clocked inverter typically includes two n-channel transistors which are connected in series and two p-channel transistors which are connected in series. However, an on-current may be decreased by connecting two transistors in series. In a conventional technique, channel widths W of the two transistors connected in series are designed wide in order to increase the on-current. Accordingly, a transistor having the gates (gate capacitance) of the two transistors as a load is required to be designed to have a wide channel width W, which results in imposing a larger load on the clocked inverter as a whole, preventing a high frequency operation. According to the invention, however, a double-gate transistor (two transistors connected in series) is not required to be used for controlling a potential supply to an output terminal of the clocked inverter, but a single gate transistor can be used instead. As a result, a channel width W of a transistor is not required to be designed wide, thus a size of transistor can be reduced which allows high integration of the elements. As a load imposed on an element which uses the gate of the transistor can be reduced, a load imposed on the clocked inverter as a whole is reduced as a high frequency operation can be realized. Further, current supply capacity of a transistor to an output terminal can be enhanced while suppressing a channel width W thereof. Accordingly, it can be prevented that a waveform of a signal outputted from the flip-flop circuit is rounded due to a load of the circuit of the succeeding stage:

Embodiment Mode 2

In this embodiment mode, a configuration of the shift register of the invention is described.

Figure 3:
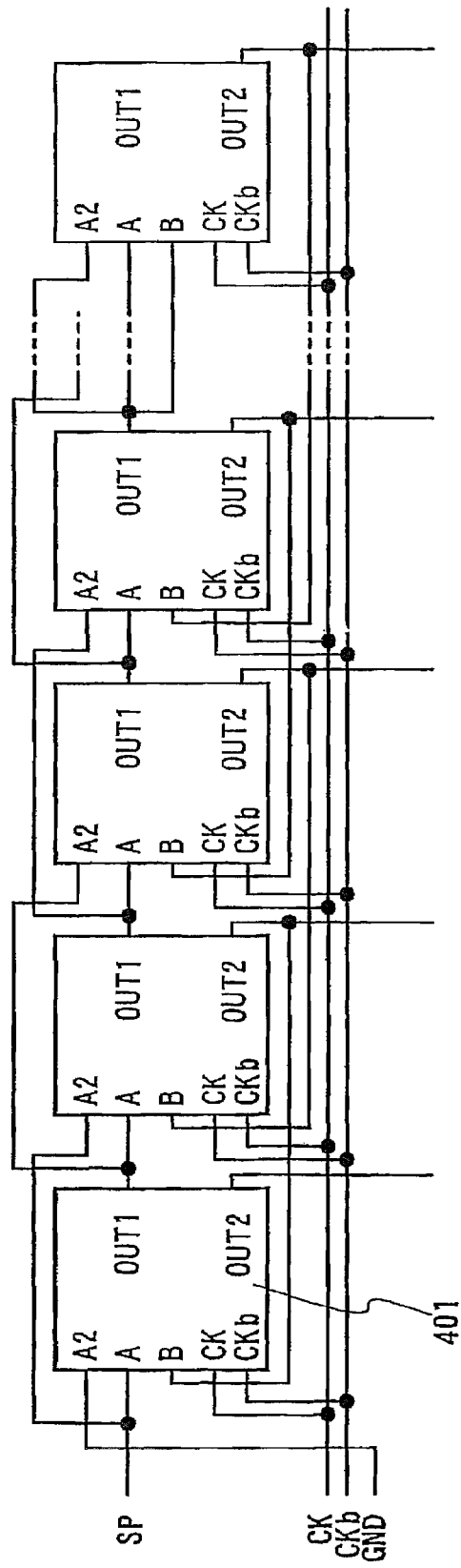
FIG. 3 is a block diagram showing a configuration of the shift register of the invention.

FIG. 3 shows a configuration of the shift register of this embodiment mode. The shift register of the invention includes a plurality of flip-flop circuits 401 each of which is inputted with the signal A from the output terminal OUT1 of the preceding stage, the signal A2 from the output terminal OUT1 of two stages before, and the signal B from the output terminal OUT2 of the succeeding stage. The flip-flop circuit 401 of the first stage is inputted with a start pulse signal SP instead of the signal A and supplied with a potential of ground instead of the signal A2. The flip-flop circuit 401 of the second stage is inputted with a start pulse signal SP instead of the signal A2. The flip-flop circuit 401 of the last stage is inputted with the signal A instead of the signal B.

A signal from the output terminal OUT2 of each of the flip-flop circuits 401 is inputted to the circuit as the succeeding stage of the shift register.

This embodiment mode can be freely implemented in combination with Embodiment Mode 1.

Embodiment Mode 3

In this embodiment mode, a configuration for reducing a load imposed on a wiring for supplying the dock signal CK to a flip-flop circuit is described.

Figure 4A:
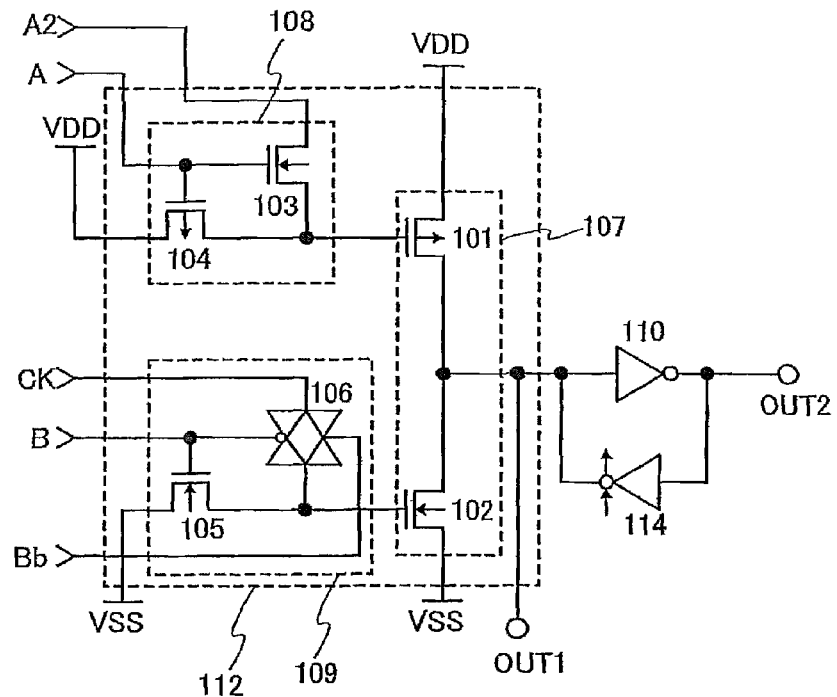
FIGS. 4A and 4B are circuit diagrams of a flip-flop circuit included in the shift register of the invention.

FIG. 4A shows an example in which an inverter 114 is used instead of the clocked inverter 111 in the flip-flop circuit shown in FIG. 1A. Note that in FIG. 4A, elements already shown in FIG. 1A are denoted by the same reference numerals.

In FIG. 4A, an output terminal of the inverter 110 and an input terminal of the inverter 114 are connected to the output terminal OUT2 of the flip-flop circuit. An input terminal of the inverter 110 and an output terminal of the inverter 114 are connected to the output terminal OUT1 of the clocked inverter 112.

In FIG. 4A, the number of the clocked inverters connected to a wiring for supplying the clock signal is less than that of the flip-flop circuit shown in FIG. 1A, thus a load imposed on the wiring can be reduced.

Figure 4B:
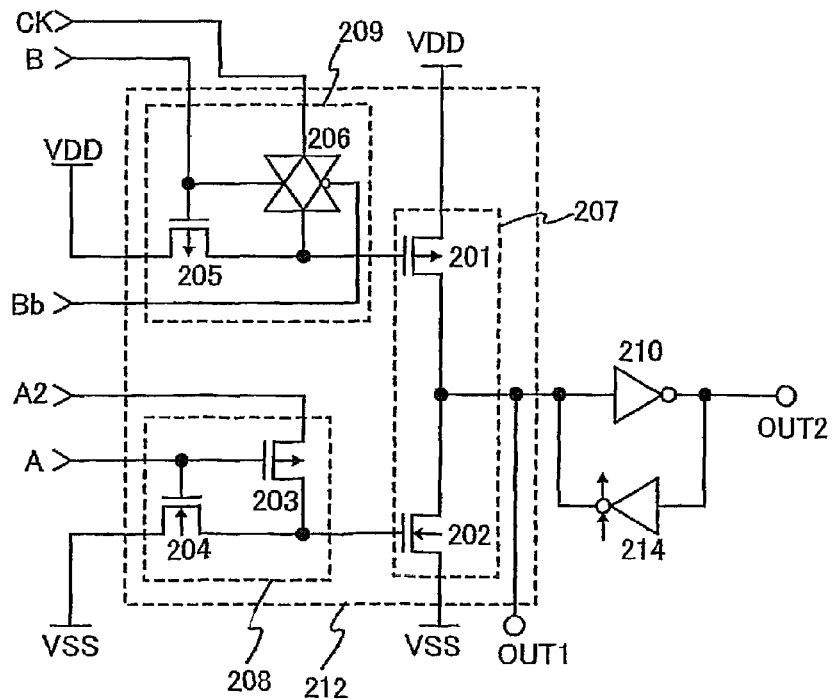

FIG. 4B shows an example in which an inverter 214 is used instead of the clocked inverter 211 in the flip-flop circuit shown in FIG. 2A. Note that in FIG. 4B, elements already shown in FIG. 2A are denoted by the same reference numerals.

In FIG. 4B, an output terminal of the inverter 210 and an input terminal of the inverter 214 are connected to the output terminal OUT2 of the flip-flop circuit. An input terminal of the inverter 210 and an output terminal of the inverter 214 are connected to the output terminal OUT1 of the clocked inverter 212.

In FIG. 4B, similarly to FIG. 4A, the number of the clocked inverters connected to a wiring for supplying the clock signal is less than that of the flip-flop circuit shown in FIG. 2A, thus a load imposed on the wiring can be reduced.

This embodiment mode can be freely implemented in combination with Embodiment Modes 1 and 2.

Embodiment Mode 4

In this embodiment mode, a configuration in which a load imposed on a wiring for supplying the clock signal CK to the flip-flop circuit is further reduced is described.

Figure 5A:
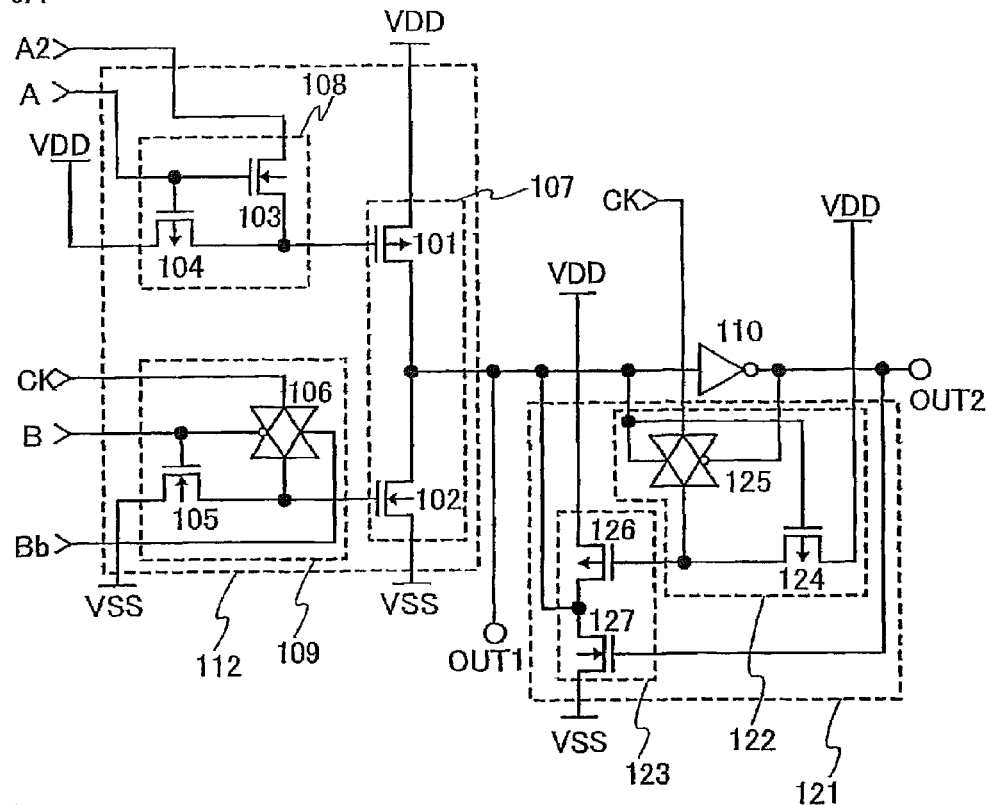
FIGS. 5A and 5B are a circuit diagram and a timing chart of a flip-flop circuit included in the shift register of the invention respectively.

FIG. 5A shows one mode of a flip-flop circuit included in a shift register of this embodiment mode. FIG. 5A shows an example in which a clocked inverter 121 including a third compensation circuit 122 and an inverter 123 is used instead of the clocked inverter 111 included in the flip-flop circuit shown in FIG. 1A. Note that in FIG. 5A, elements already shown in FIG. 1A are denoted by the same reference numerals.

The clocked inverter 121 includes the third compensation circuit 122 including a transistor 124 and a transmission gate 125, and the inverter 123 including transistors 126 and 127.

In the clocked inverter 121, a gate of the transistor 124 and a second control terminal of the transmission gate 125 are connected to the output terminal OUT1 of the clocked inverter 112. Each source of the transistors 124 and 126 is connected to a first power source and supplied with the power source potential VDD respectively. An input terminal of the transmission gate 125 is supplied with the clock signal CK. An output terminal of the transmission gate 125 and a drain of the transistor 124 are connected to a gate of the transistor 126. A gate of a transistor 127 is connected to the output terminal OUT2 of the flip-flop circuit and a source thereof is connected to a second power source and supplied with the power source potential VSS. Each drain of the transistors 126 and 127 is connected to the output terminal OUT1 of the clocked inverter 112.

Figure 5B:
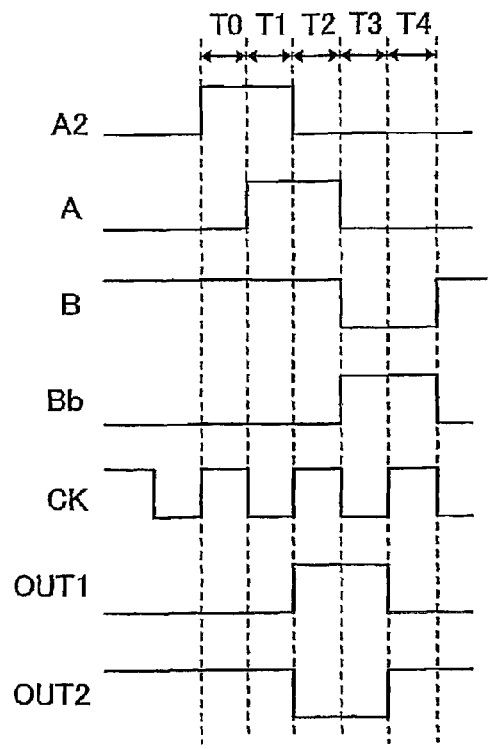

FIG. 5B shows a timing chart of the signals A, B, A2, Bb, the clock signal CK, the signal outputted from the output terminal OUT1, and the signal outputted from the output terminal OUT2 in the flip-flop circuit of FIG. 5A. As shown in FIG. 5B, potentials at the output terminals OUT1 and OUT2 can be controlled in each of periods T0 to T4.

In FIG. 5A, the number of the clocked inverters connected to a wiring for supplying the clock signal is less than that of the flip-flop circuit shown in FIG. 1A, thus a load imposed on the wiring can be reduced.

Figure 6A:
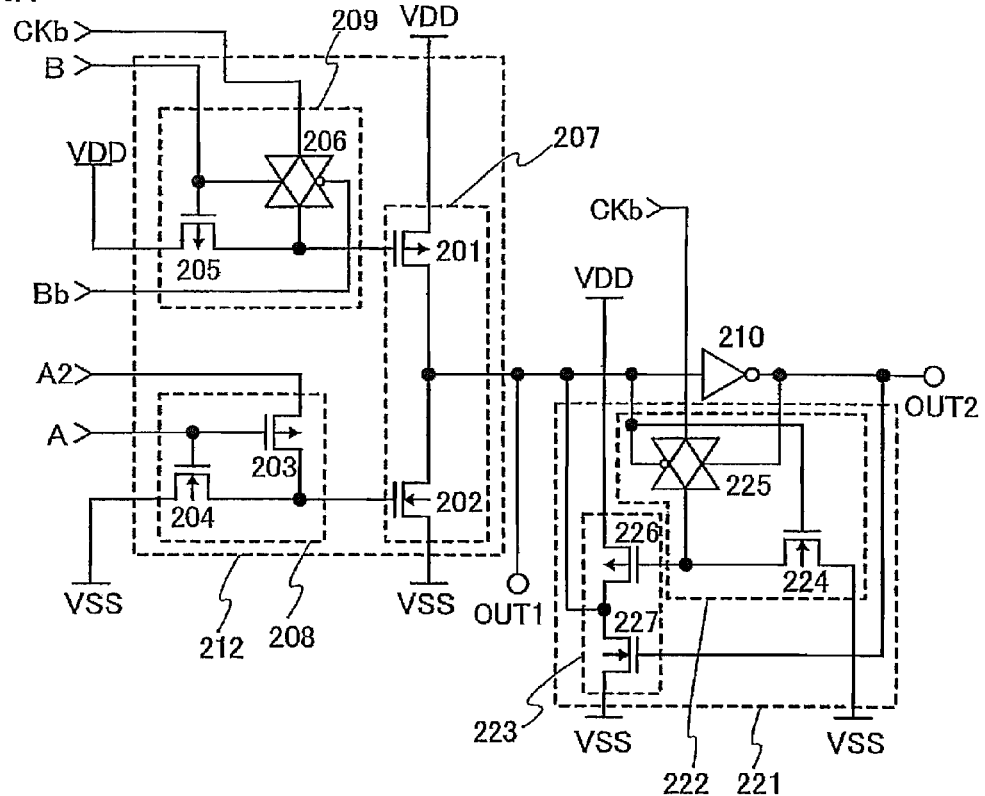
FIGS. 6A and 6B are a circuit diagram and a timing chart of a flip-flop circuit included in the shift register of the invention respectively.

FIG. 6A shows another mode of a flip-flop circuit included in the shift register of this embodiment mode. FIG. 6A shows an example in which a clocked inverter 221 including a third compensation circuit 222 and an inverter 223 is used instead of the clocked inverter 211 in the flip-flop circuit shown in FIG. 2A. Note that in FIG. 6A, elements already shown in FIG. 2A are denoted by the same reference numerals.

The clocked inverter 221 includes the third compensation circuit 222 including a transistor 224 and a transmission gate 225 and the inverter 223 including transistors 226 and 227.

In the clocked inverter 221, a gate of the transistor 224 and a first control terminal of the transmission gate 225 are connected to the output terminal OUT1 of the clocked inverter 212. A source of the transistor 226 is connected to the first power source and supplied with the power source potential VDD. Each source of the transistors 224 and 227 is connected to a second power source and supplied with the power source potential VSS. An input terminal of the transmission gate 225 is supplied with the inverted clock signal CKb. An output terminal of the transmission gate 225 and a drain of the transistor 224 are connected to a gate of the transistor 226. A gate of the transistor 227 is connected to the output terminal OUT2 of the flip-flop circuit. Each drain of the transistors 226 and 227 is connected to the output terminal OUT1 of the clocked inverter 212.

Figure 6B:
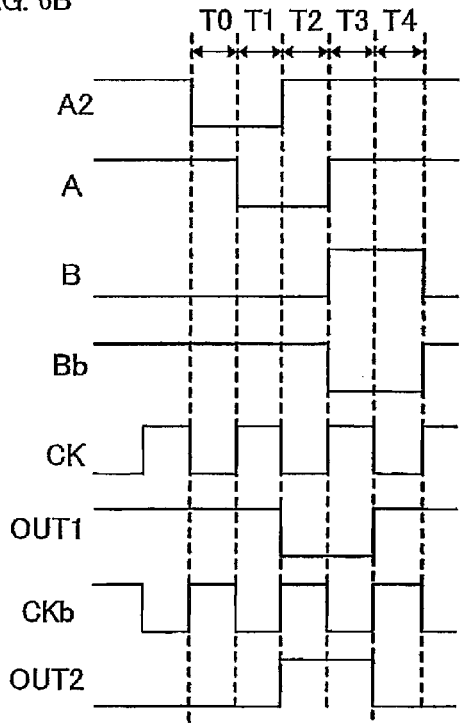

FIG. 6B shows a timing chart of the signals A, B, A2, Bb, the clock signal CK, the signal outputted from the output terminal OUT1, and the signal outputted from the output terminal OUT2 in the flip-flop circuit of FIG. 6A. As shown in FIG. 6B, potentials at the output terminals OUT1 and OUT2 can be controlled in each of periods T0 to T4.

In FIG. 6A, the number of the clocked inverters connected to a wiring for supplying the clock signal is less than that of the flip-flop circuit shown in FIG. 2A, thus a load imposed on the wiring can be reduced.

This embodiment mode can be freely implemented in combination with Embodiment Modes 1 and 2.

Embodiment 1

Figure 9:
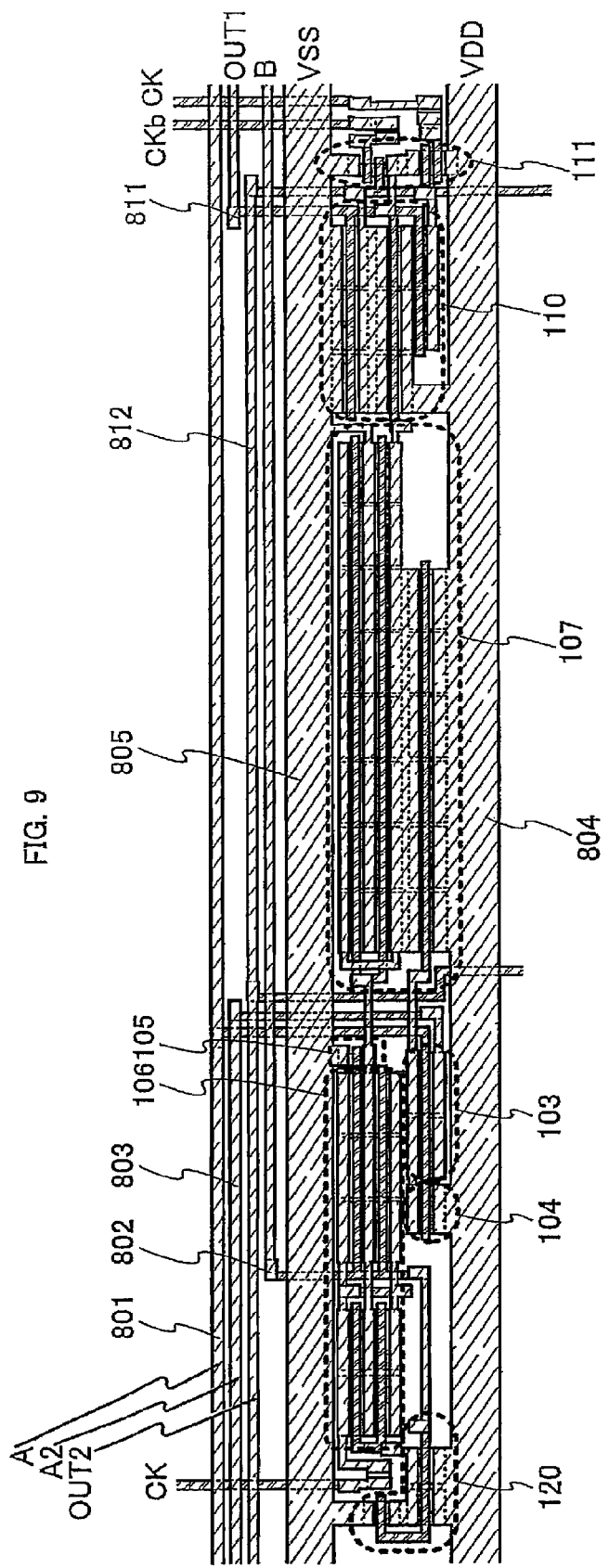
FIG. 9 is a mask layout of a flip-flop circuit included in the shift register of the invention.

FIG. 9 shows a mask layout of a flip-flop circuit included in the shift register of the invention. The mask layout shown in FIG. 9 corresponds to one stage of the shift register shown in FIG. 1A. The elements already shown in FIG. 1A are denoted by the same reference numerals. A reference numeral 120 corresponds to an inverter which can invert the signal B.

In FIG. 9, the signal A is supplied to a wiring 801, the signal B is supplied to a wiring 802, and the signal A2 is supplied to a wiring 803. The power source potential VDD is supplied to a wiring 804 and the power source potential VSS is supplied to a wiring 805. A potential of the output terminal OUT1 is supplied to a wiring 811 and a potential of the output terminal OUT2 is supplied to a wiring 812.

This embodiment can be implemented in combination with the aforementioned embodiment modes.

Embodiment 2

Figure 10:
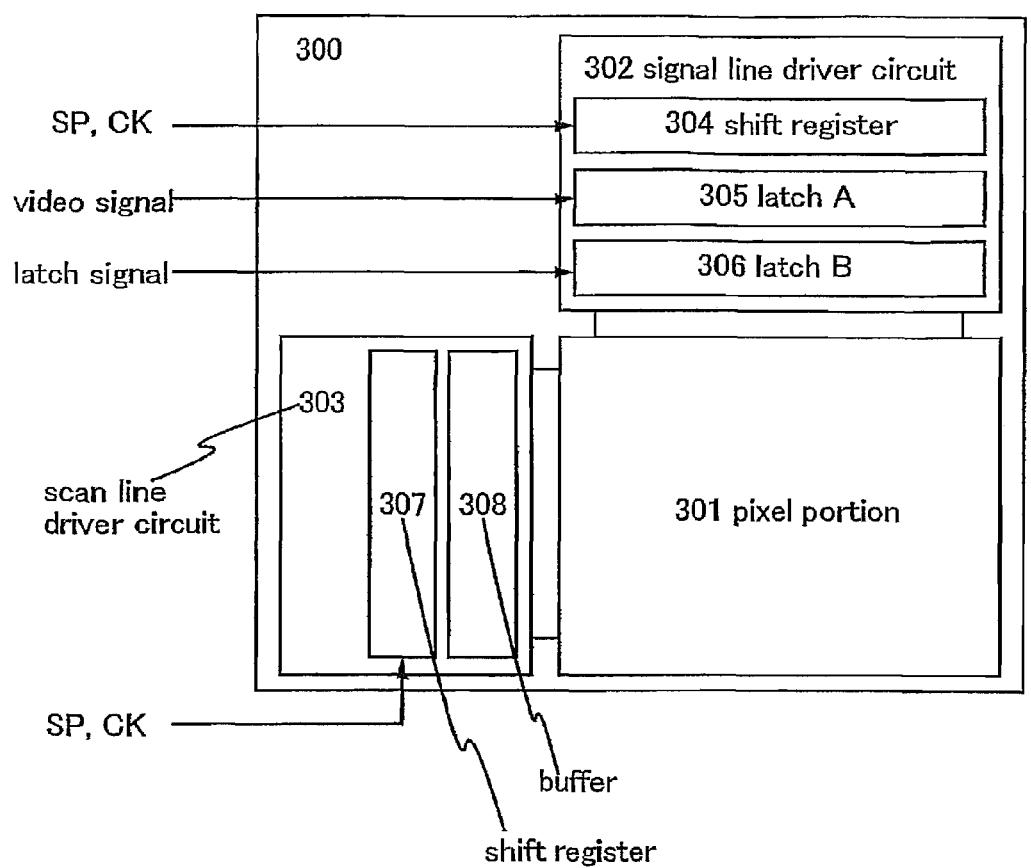
FIG. 10 is a block diagram of the semiconductor display device of the invention using the shift register of the invention.

FIG. 10 shows a specific structure of a panel included in the semiconductor display device of the invention. In the semiconductor display device of the invention as shown in FIG. 10, a panel 300 includes a pixel portion 301, a signal line driver circuit 302, and a scan line driver circuit 303.

In FIG. 10, the signal line driver circuit 302 includes a shift register 304 of the invention, a latch A 305, and a latch B 306. The shift register 304 has a configuration described in the aforementioned embodiment modes and embodiment. The shift register 304 is inputted with various control signals such as the clock signal CK and the start pulse signal SP. When the clock signal CK and the start pulse signal SP are inputted, a timing signal is outputted from a flip-flop circuit of each stage in the shift register 304. The outputted timing signal is sequentially inputted to the latch A 305 of the first stage. When the timing signal is inputted to the latch A 305, a video signal is sequentially written to the latch A 305 in synchronization with a pulse of the timing signal and held therein. In this embodiment mode, video signals are sequentially written to the latch A 305, however, the invention is not limited to this configuration. A plurality of stages of the latch A 305 may be divided into some groups and video signals may be inputted to the groups in parallel, that is a division drive may be performed as well. The number of groups divided at this time is referred to as a division number. For example, when dividing a latch into groups per four stages, this drive is called the division drive of four division. Here, the stage refers to a circuit which holds one video signal.

A period in which video signals are written to all the stages of latches of the latch A 305 is referred to as a row selection period. In actuality, the row selection period may further include a horizontal flyback period.

When one row selection period is terminated, a latch signal corresponding to one control signal is supplied to the latch B 306 of the second stage, thus the video signals held in the latch A 305 are written to the latch B 306 all at once in synchronization with the latch signal. The latch A 305 which finished transmitting the video signals to the latch B 306 is sequentially written a video signal of next bit in synchronization with a timing signal outputted from the shift register 304. In this one row selection period of second time, the video signals written and held in the latch B 306 are inputted to the pixel portion 301.

Next, a configuration of the scan line driver circuit 303 is described. The scan line driver circuit 303 includes a shift register 307 of the invention and a buffer 308. A level shifter may be included as well depending on the case. The shift register 307 has a configuration described in the aforementioned embodiment modes and embodiment. In the scan line driver circuit 303, when the clock signal CK and the start pulse signal SP are inputted to the shift register 307, a selection signal is outputted from a flip-flop circuit of each stage. The outputted selection signal is amplified by the buffer 308 and supplied to a corresponding scan line. Operations of transistors included in one row of pixels are controlled by the selection signal supplied to the scan line, therefore, it is preferable that the buffer 308 can supply a relatively large current to the scan line.

In this embodiment, an example of using the shift register of the invention in the signal line driver circuit 302 and the scan line driver circuit 303 is described, however, the semiconductor display device of the invention is not limited to this configuration. The shift register of the invention may be used in only the signal line driver circuit 302 or the scan line driver circuit 303.

In the case of using the shift register of the invention in the signal line driver circuit 302 and the scan line driver circuit 303, the signal line driver circuit 302 and the scan line driver circuit 303 are formed over the same substrate as the pixel portion 301. In the case of using the shift register of the invention only in the signal line driver circuit 302, the signal line driver circuit 302 is formed over the same substrate as the pixel portion 301. In the case of using the shift register of the invention only in the scan line driver circuit 303, the scan line driver circuit 303 is formed over the same substrate as the pixel portion 301.

This embodiment can be implemented in combination with the aforementioned embodiment modes or embodiment.

Embodiment 3

The shift register and the semiconductor display device of the invention can be applied to electronic devices such as a video camera, a digital camera, a goggle type display (a head mounted display), a navigation system, an audio reproducing device (a car audio set, an audio component system and the like), a computer, a game machine, a portable information terminal (a mobile computer, a portable phone, a portable game machine, an electronic book or the like), and an image reproducing device provided with a recording medium (specifically, a device which reproduces a recording medium such as a DVD: Digital Versatile Disc and has a display capable of displaying the reproduced image). In particular, a flexible substrate can be formed lighter and thinner as compared to a glass substrate and the like, therefore, a lightweight, small, and thin semiconductor device can be realized when attaching a peeled semiconductor element to the flexible substrate. Accordingly, the semiconductor display device and the shift register of the invention are suitable for a portable electronic device and a display device having a relatively large display. Specific examples of these electronic devices are shown in FIGS. 11A to 11E.

Figure 11A:
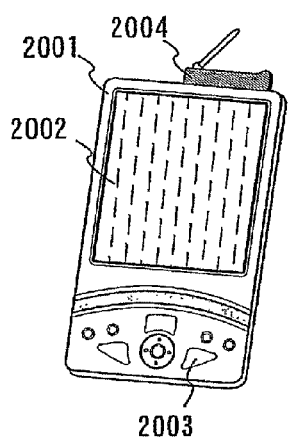
FIGS. 11A to 11E are views of electronic devices using the shift register or the semiconductor display device of the invention.

FIG. 11A illustrates a portable information terminal including a main body 2001, a display portion 2002, an operating key 2003, a modem 2004 and the like. FIG. 11A illustrates a portable information terminal of which modem 2004 is removable, however, the modem 2004 may be incorporated in the main body 2001 as well. According to the semiconductor display device or the shift register of the invention, the display portion 2002 or other circuits for processing signals are manufactured, thus the portable information terminal can be completed.

Figure 11B:
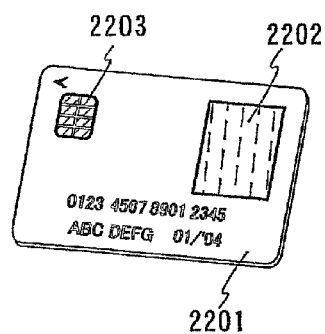

FIG. 11B illustrates an IC card including a main body 2201, a display portion 2202, a connecting terminal 2203 and the like. According to the semiconductor display device or the shift register of the invention, the display portion 2202 or other circuits for processing signals are manufactured, thus the IC card can be completed. In FIG. 11B, a contact type electronic card is illustrated, however, the semiconductor display device or the shift register of the invention can be applied to a non-contact type IC card and an IC card provided with contact and non-contact functions as well.

Figure 11C:
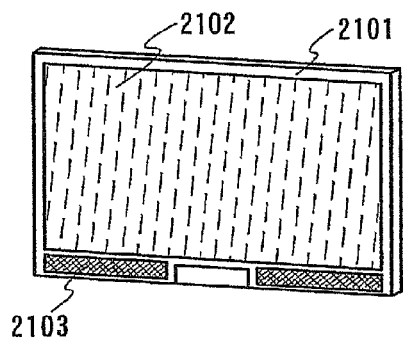

FIG. 11C illustrates a display device including a housing 2101, a display portion 2102, a speaker 2103 and the like. According to the semiconductor display device or the shift register of the invention, the display portion 2102 or other circuits for processing signals are manufactured, thus the display device can be completed. The display device includes all display devices displaying information, including ones for personal computers, TV broadcasting reception, and advertisement.

Figure 11D:
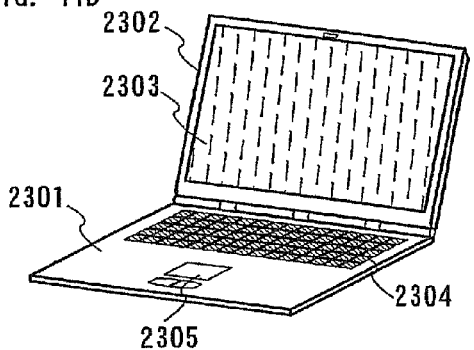

FIG. 11D illustrates a computer including a main body 2301, a housing 2302, a display portion 2303, a keyboard 2304, a pointing mouse 2305 and the like. A computer may be a computer in which a monitor and a main body including a CPU are integrated (for example, a notebook computer), or a computer in which a monitor and a main body including a CPU are separated (for example, a desktop computer). According to the semiconductor display device or the shift register of the invention, the display portion 2303 or other circuits for processing signals are manufactured, thus the computer can be completed.

Figure 11E:
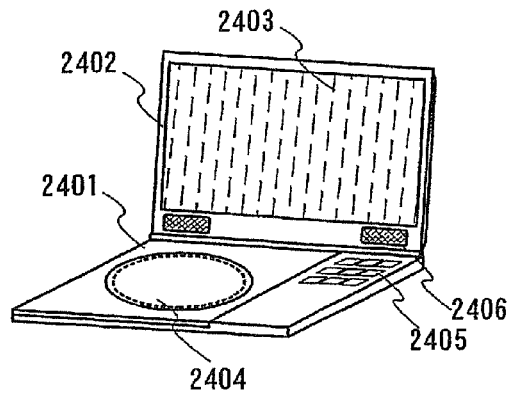

FIG. 11E illustrates an image reproducing device provided with a recording medium (specifically, a DVD reproducing device), including a main body 2401, a housing 2402, a display portion 2403, a recording medium (a DVD and the like) reading portion 2404, an operating key 2405, a speaker portion 2406 and the like. The image reproducing device provided with a recording medium includes a home game machine and the like. According to the semiconductor display device or the shift register of the invention, the display portion 2403 or other circuits for processing signals are manufactured, thus the image reproducing device can be completed.

It is to be noted that the invention has advantages such as downsizing of a housing and the area occupied by a driver circuit in an internal circuit, reduction in manufacturing cost and power consumption, and high frequency operation in all of the aforementioned electronic devices, in particular in a portable terminal.

As described above, an application range of the semiconductor display device or the shift register of the invention is quite wide, thus the invention can be applied to electronic devise of all fields. The electronic devices of this embodiment can be implemented in combination with the aforementioned embodiment modes or embodiments.

This application is based on Japanese Patent Application serial no. 2004-176199 filed in Japan Patent Office on Jun. 14, 2004, the entire contents of which are hereby incorporated by reference.

What is claimed is:

1. A semiconductor device comprising:
a first flip-flop circuit;
a second flip-flop circuit;
a third flip-flop circuit; and
a fourth flip-flop circuit,
wherein an output of the second flip-flop circuit is inputted to a first terminal of the third flip-flop circuit,
wherein an output of the first flip-flop circuit is inputted to a second terminal of the third flip-flop circuit,
wherein an output of the fourth flip-flop circuit is inputted to a third terminal of the third flip-flop circuit,
wherein a first output of the third flip-flop circuit is inputted to the fourth flip-flop circuit, and
wherein a second output of the third flip-flop circuit is inputted to the second flip-flop circuit.

2. The semiconductor device according to claim 1,
wherein clock signal is inputted to a fourth terminal of the third flip-flop circuit.

3. The semiconductor device according to claim 2,
wherein the third flip-flop circuit comprises:
a first compensation circuit; and
a second compensation circuit.

4. The semiconductor device according to claim 3,
wherein the output of the second flip-flop circuit is inputted to a first terminal of the first compensation circuit,
wherein the output of the first flip-flop circuit is inputted to a second terminal of the first compensation circuit, and
wherein the output of the fourth flip-flop circuit is inputted to a first terminal of the second compensation circuit, and
wherein the clock signal is inputted to a second terminal of the second compensation circuit.

5. A semiconductor device comprising:
a first stage flip-flop circuit;
a second stage flip-flop circuit;
a third stage flip-flop circuit; and
a fourth stage flip-flop circuit,
wherein a start pulse is inputted to the first stage flip-flop circuit,
wherein an output of the first stage flip-flop circuit is inputted to a first terminal of the second stage flip-flop circuit,
wherein the start pulse is inputted to a second terminal of the second stage flip-flop circuit,
wherein an output of the second stage flip-flop circuit is inputted to a first terminal of the third stage flip-flop circuit,
wherein the output of the first stage flip-flop circuit is inputted to a second terminal of the third stage flip-flop circuit,
wherein an output of the fourth stage flip-flop circuit is inputted to a third terminal of the third stage flip-flop circuit,
wherein a first output of the third stage flip-flop circuit is inputted to the fourth stage flip-flop circuit, and
wherein a second output of the third stage flip-flop circuit is inputted to a third terminal of the second stage flip-flop circuit.

6. The semiconductor device according to claim 5,
wherein clock signal is inputted to a fourth terminal of the third stage flip-flop circuit.

7. The semiconductor device according to claim 6,
wherein the third stage flip-flop circuit comprises:
a first compensation circuit; and
a second compensation circuit.

8. The semiconductor device according to claim 7,
wherein the output of the second stage flip-flop circuit is inputted to a first terminal of the first compensation circuit,
wherein the output of the first stage flip-flop circuit is inputted to a second terminal of the first compensation circuit, and
wherein the output of the fourth stage flip-flop circuit is inputted to a first terminal of the second compensation circuit, and
wherein the clock signal is inputted to a second terminal of the second compensation circuit.

* * * * *